United States Patent [19]
Montgomery

[11] Patent Number: 5,123,997
[45] Date of Patent: Jun. 23, 1992

[54] PLENUM TYPE CRYSTAL GROWTH PROCESS

[75] Inventor: Kenneth E. Montgomery, Tracy, Calif.

[73] Assignee: The United States of America as represented by the United States Department of Energy, Washington, D.C.

[21] Appl. No.: 428,536

[22] Filed: Oct. 30, 1989

[51] Int. Cl.$^5$ ................................. C30B 7/00
[52] U.S. Cl. ................................. 156/621; 156/624; 156/DIG. 71; 422/245; 23/301; 23/302 R
[58] Field of Search ........... 156/621, 622, 623 R, 156/623 Q, 624, DIG. 71; 23/295 R, 301, 302 R; 422/245

[56] References Cited

U.S. PATENT DOCUMENTS

| | | | |
|---|---|---|---|
| H580 | 2/1989 | Vig | 156/623 Q |
| 1,353,571 | 9/1920 | Dreibrodt | 156/621 |
| 1,646,454 | 10/1927 | Isaachsen | 23/301 |
| 2,204,180 | 6/1940 | Gerlach | 156/623 R |
| 2,459,869 | 1/1949 | Christensen et al. | 156/623 R |
| 2,589,310 | 3/1952 | Tournier | 156/621 |
| 2,615,797 | 10/1952 | Bruzau | 156/621 |
| 2,863,740 | 12/1958 | Christensen | 156/623 R |
| 3,383,180 | 5/1968 | Kralik et al. | 23/302 R |
| 3,560,168 | 2/1971 | Stanton et al. | 156/623 R |
| 4,283,247 | 8/1981 | Roques et al. | 156/624 |

FOREIGN PATENT DOCUMENTS

| | | | |
|---|---|---|---|
| 3419722 | 12/1984 | Fed. Rep. of Germany | 156/621 |
| 0252959 | 1/1988 | Fed. Rep. of Germany | 156/621 |
| 930077 | 1/1948 | France | 156/623 R |
| 0425420 | 8/1982 | U.S.S.R. | 156/621 |
| 1065507 | 1/1984 | U.S.S.R. | 156/621 |

OTHER PUBLICATIONS

Nicolau, J. F. "A Crystallizer for Growing Large Singe Crystals from Solution under Steady-State Concentration Convection Conditions" Kristall und Technik vol. 9, No. 12, pp. 1331-1347 (1974).

Primary Examiner—R. Bruce Breneman
Attorney, Agent, or Firm—Henry P. Sartorio; L. E. Carnahan; William R. Moser

[57] ABSTRACT

Crystals are grown in a tank which is divided by a baffle into a crystal growth region above the baffle and a plenum region below the baffle. A turbine blade or stirring wheel is positioned in a turbine tube which extends through the baffle to generate a flow of solution from the crystal growing region to the plenum region. The solution is pressurized as it flows into the plenum region. The pressurized solution flows back to the crystal growing region through return flow tubes extending through the baffle. Growing crystals are positioned near the ends of the return flow tubes to receive a direct flow of solution.

4 Claims, 1 Drawing Sheet

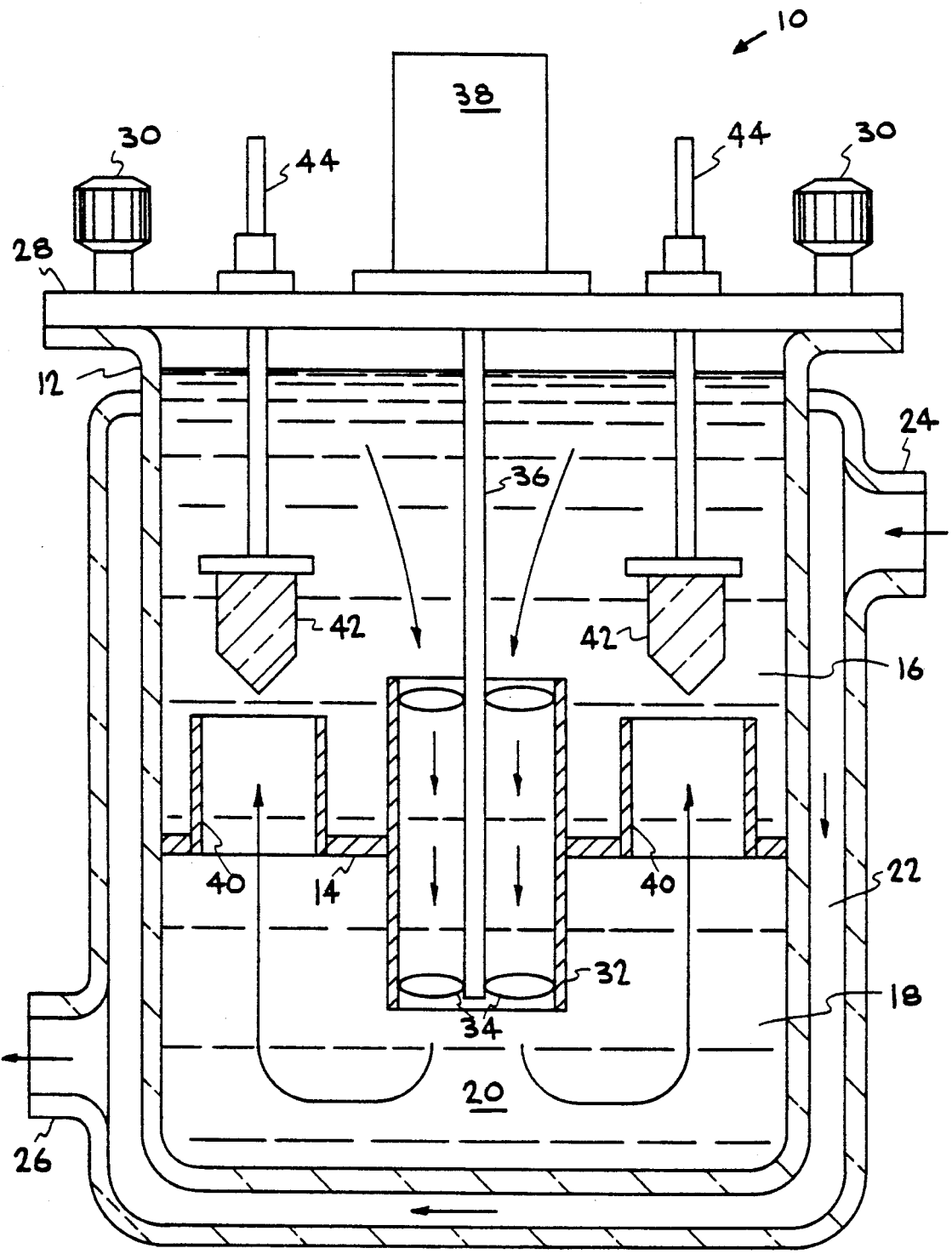

PLENUM TYPE CRYSTAL GROWTH PROCESS

The United States Government has rights in this invention pursuant to Contract No. W-7405-ENG-48 between the U.S. Department of Energy and the University of California for the operation of the Lawrence Livermore National Laboratory.

BACKGROUND OF THE INVENTION

The invention relates to method and apparatus for growing crystals.

Large KDP crystals with high damage threshold are required for the NOVA and future high power lasers at LLNL. The crystals are used for frequency conversion to produce laser wavelengths which may be more optimum to produce laser fusion. Theoretically, a damage threshold of 80 $J/cm^2$ in 1 ns pulses can be reached. For the next generation laser, 40 $J/cm^2$ in 10 ns pulses is desired. However, the best crystals presently available, which are annealed, have a damage threshold of 15 $J/cm^2$ in 10 ns pulses.

Crystals are grown by placing a seed crystal in a crystal growth solution. In general, it is desirable to move the crystal growth solution over the crystal face to promote growth. The motion of the solution over the crystal face is typically produced by a mechanical apparatus which either moves the crystal in the solution or moves the solution over the crystal. An improved flow arrangement would improve crystal growth.

SUMMARY OF THE INVENTION

Accordingly, it is an object of the invention to provide improved method and apparatus for growing crystals.

It is another object of the invention to provide a crystal growing method and apparatus with an improved flow arrangement.

The invention is plenum type crystal growth chamber apparatus and method for growing crystals. Crystals are grown in a tank or chamber which is divided by a baffle into a crystal growth region above the baffle and a plenum region below the baffle. A turbine blade or stirring wheel is positioned in a turbine tube which extends through the baffle. The turbine generates fluid flow to pull crystal growth solution from the crystal growth region into the plenum region. At least one solution flow tube also extends through the baffle to allow pressurized crystal fluid to flow back up into the crystal growth region from the plenum region. Growing crystals are positioned above each solution flow tube so that solution flows directly into the crystal face to promote growth. The plenum type crystal growth chamber of the invention provides for continuous flow of crystal growth solution between the top and bottom of the chamber. The fluid is pressurized when it is pumped into the plenum region. The pressure increase depends on the position of the baffle, the size of the turbine tube, turbine speed, and the number and diameter of the solution flow tubes.

BRIEF DESCRIPTION OF THE DRAWINGS

In the accompanying drawings:

The FIGURE is a cross-sectional view of a plenum type crystal growth chamber according to the invention.

DETAILED DESCRIPTION OF THE PREFERRED EMBODIMENTS

As shown in the FIGURE plenum type crystal growth chamber 10 is formed of chamber or tank 12 which is separated by baffle 14 into upper crystal growth region or chamber 16 and lower plenum region 18. Tank 12 is filled with crystal growing solution 20. Tank 12 is surrounded on the side and bottom by water jacket 22 through which water or other fluid is flowed by means of jacket inlet 24 and jacket outlet 26 to maintain crystal growing solution 20 at a desired temperature. Preferrably crystal growth solution 20 is maintained near its saturation temperature for maximum crystal growth. Chamber 10 also has a top 28 which is secured to tank 12 by fastening means 30.

Turbine tube 32 extends through baffle 14 allowing continuous fluid communication between crystal growth region 16 and plenum region 18. Turbine or other stirring means 34 is positioned within turbine tube 32. Turbine 34 is connected by drive shaft 36 to motor 38 which is mounted on chamber top 28 with shaft 36 extending through top 28. Turbine 34 is rotated by motor 38 to produce fluid flow to pull crystal growing solution 20 from the top of the tank into the bottom of the tank, i.e., from crystal growing region 16 to plenum region 18. At least one solution flow tube 40 also extends through baffle 14 to provide continuous recirculating flow of crystal growing solution 20 from plenum region 18 back up into upper crystal growing region 16. A growing crystal 42 is positioned directly above each solution flow tube 40 so that the return solution flow is directed into the crystal face. Crystal 42 is attached to crystal mounting means 44 which extend through top 28 into crystal growing region 16. Mounting means 44 are vertically adjustable.

The plenum type crystal growing chamber of the invention continually pressurizes the crystal growing solution in the tank and provides direct flow into the growing crystal face. The pressure generated and fluid flow characteristics are a function of several design parameters of the system. The height of the baffle in the chamber will affect the pressure. If the baffle is positioned high in the tank (i.e. the plenum region is large), the pressure in the plenum region will decrease. If the baffle is low in the tank the pressure is increased. The diameter of the turbine tube, the position of the turbine tube, and turbine speed will also affect the pressure. The turbine tube may be moved vertically so that it extends higher or lower into the plenum region. The number and diameter of the solution flow tubes is also an important parameter. The diameters are typically smaller than the turbine tube to increase flow rate.

The invention can be used to grow KDP and other crystals.

Changes and modifications in the specifically described embodiments can be carried out without departing from the scope of the invention which is intended to be limited only by the scope of the appended claims.

I claim:

1. A method of growing a crystal, comprising:
    dividing a crystal growth chamber into an upper crystal growing region and a lower plenum region by means of a stationary horizontal baffle extending across the chamber;
    providing a turbine tube through the baffle between the crystal growing region and plenum region;

providing at least one return flow tube through the baffle between the crystals growing region and plenum region, each return flow tube having a diameter less than the turbine flow tube;

filling the crystal growing region and plenum region with crystal growing solution;

providing flow generating means in the turbine tube;

continuously drawing crystal growing solution from the crystal growing region through the turbine tube into the plenum region by actuating the flow generating means in the turbine tube to pressurize crystal growing solution in the plenum region and to produce a continuously recirculating flow of crystal growing solution from the pressurized plenum region through the at least one return flow tube to the crystal growing region;

positioning a growing crystal in the crystal growing region at each return flow tube so that the recirculating crystal growing solution flows directly into the crystal.

2. The method of claim 1 further comprising maintaining the crystal growing solution in the crystal growing region and plenum region at a substantially constant temperature.

3. The method of claim 1 comprising positioning the baffle at a height, forming the turbine tube and return flow tube of diameters, and flowing solution from the crystal growing region to the plenum region at a rate to control pressure increase in the plenum region and control the continuously recirculating flow of crystal growing solution from the plenum region to the crystal growing region.

4. The method of claim 2 further comprising maintaining the crystal growing solution at about its saturation temperature.

* * * * *